United States Patent
Kasztenny et al.

(10) Patent No.: US 7,567,881 B2
(45) Date of Patent: Jul. 28, 2009

(54) SELF-ADJUSTING VOLTAGE FILTERING TECHNIQUE COMPENSATING FOR DYNAMIC ERRORS OF CAPACITIVE VOLTAGE TRANSFORMERS

(75) Inventors: Bogdan Z. Kasztenny, Markham (CA); William James Premerlani, Scotia, NY (US); Iulian Raducanu, North York (CA)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/694,588

(22) Filed: Mar. 30, 2007

(65) Prior Publication Data

US 2008/0243413 A1 Oct. 2, 2008

(51) Int. Cl.
*G01R 35/00* (2006.01)
(52) U.S. Cl. .................................... 702/107
(58) Field of Classification Search ............... 702/57, 702/58, 60, 62, 68, 69, 74–77, 85, 90, 106, 702/107, 182–184, 190, 191, 193; 324/522; 360/65; 361/59
See application file for complete search history.

(56) References Cited

U.S. PATENT DOCUMENTS

| | | | | |
|---|---|---|---|---|
| 5,255,202 A | * | 10/1993 | Kido et al. | 702/190 |
| 5,675,394 A | * | 10/1997 | Choi | 348/614 |
| 5,703,745 A | | 12/1997 | Roberts et al. | |
| 6,041,290 A | * | 3/2000 | Matt et al. | 702/191 |
| 6,420,875 B1 | * | 7/2002 | Kasztenny et al. | 324/522 |
| 7,236,112 B2 | * | 6/2007 | Hickling | 341/143 |
| 2005/0213241 A1 | * | 9/2005 | Cideciyan et al. | 360/65 |
| 2006/0222187 A1 | * | 10/2006 | Jarrett et al. | 381/92 |

OTHER PUBLICATIONS

"Dynamic Compensation of Capacitive Voltage Transformers", Izykowski et al., IEEE Transactions on Power Delivery, vol. 13, No. 1, Jan. 1998, pp. 116-122.
"Distance Relays and Capacitive Voltage Transformers—Balancing Speed and Transient Overreach", Kasztenny et al., 53rd Annual Conference for Protective Relay Engineers, College Station, TX, Apr. 11-13, 2000.

* cited by examiner

*Primary Examiner*—Edward Raymond
*Assistant Examiner*—Mohamed Charioui
(74) *Attorney, Agent, or Firm*—Cantor Colburn LLP

(57) ABSTRACT

A method of digitally correcting the raw output voltage from a Capacitive Voltage Transformer (CVT) with the intent to remove transient components impacting on transient accuracy of protection function. A typical CVT is represented using three parameters in the linear CVT model. A digital filter designed based on the three parameters and incorporating a dedicated mechanism to ensure numerical stability of the former. A method of self-adjusting the said filter based on system events and performed after the method has been deployed in the field and supplied from a specific CVT.

22 Claims, 12 Drawing Sheets

SELF-ADJUSTING VOLTAGE FILTERING TECHNIQUE COMPENSATING FOR DYNAMIC ERRORS OF CAPACITIVE VOLTAGE TRANSFORMERS

BACKGROUND OF THE INVENTION

1. Field of the Invention

The present invention relates to the digital measurement of voltage signals for protective relaying purposes in situations where the voltage is derived from, a capacitive voltage transformer (CVT), and particularly to improving the dynamic accuracy of protective functions that are dependant on voltage measurement.

2. Description of Background

Protective relays are devices that are designed to identify and isolate failures in a power system. A failure often takes the form of an insulation breakdown, (fault) and results in a change in a system voltage and/or current. Typically, within a power system, protective relays are configured to detect failures of a specific portion of the power system, theses specific portions of the power system being commonly referred to as zone. A protective relay guarding against short circuits should never respond to events other than failures within its particular zone. Further, the longer a fault persists in the power system, the greater the likelihood that the stability of the entire power system will be compromised. For this reason, a protective relay should be designed and configured to correctly identity faults that have occurred within its zone in a minimum possible time period.

Conventionally, microprocessor-based protection devices for power systems operate by sampling input currents and/or voltages at regular time intervals, digitally extracting selected properties of those signals (e.g., magnitudes, angles, time derivatives, harmonies, etc.), and comparing the signal properties in reference to one another or in reference to a threshold. Instrument transformers are used to isolate a protective relay from the power system and to reduce a signal to a level wherein the signal can be processed by the electronic circuitry of the relay. In high voltage and extra high voltage power systems, CVTs are often used to reduce a voltage from a range of hundreds-of-thousands of volts (a primary voltage level) to tens-of-volts (a secondary voltage level) before supplying the voltage signals to a protective relay. Typically, CVTs are cheaper than magnetic voltage transformers but create problems for protective relays since they have a tendency to add specific transients to the voltage signals as they are transformed to the secondary level.

CVT generated transients tend to have relatively significant magnitudes and long durations. This aspect is particularly important for protecting transmission lines where the Source Impedance Ratio (SIR—the ratio between the system equivalent impedance and the relay reach impedance) is large. The primary voltage during a line fault is very low under a large SIR. The voltage signal is crucial for proper operation of the distance relay but becomes significantly distorted by transient components that are not present in the power system but are generated by the CVT.

Generally, the CVT transient will have a decaying DC component bin may also have a decaying oscillatory component(s). When the well-known Fourier algorithm is applied to voltage measurement (which is typical in microprocessor-based relays) the magnitude may be significantly underestimated due to the CVT transient. This will impact the fault identification performance of the relay. Protective relays typically incorporate a mechanism that can deal with CVT transients to some extent. Known methods include the introduction of an adaptive delay or the dynamic reduction of the fault detection zone of the relay.

Another method of dealing with the CVT transient is to insert a filter into the voltage signal path that is an inverted representation of the CVT transfer function. This removes the distortion generated by the CVT, thus resulting in a signal that is an accurate reproduction of the power system voltage. This method performs optimally only when the filter coefficients reflect the parameters of the particular CVT that is connected to the relay.

Presently, there is a need for a self-tuning mechanism that allows application of the CVT correcting filter without a prior knowledge of the parameters of the corrected CVT, and also allows constant adjustment of the properties of the filter in order to follow changes in the CVT.

SUMMARY OF THE INVENTION

The present invention relates to a method of compensating a Capacitive Voltage Transformer (CVT) for transient errors, the method comprising representing raw output voltage of a CVT by a series of digitally encoded samples, and constructing a digital, filter, wherein the design for the digital filter is based upon an equivalent circuit diagram of the CVT. The method further comprises filtering the raw output voltage, wherein the raw output voltage is filtered using the digital filter, determining unknown parameters of the equivalent circuit diagram of the CVT, and determining filter coefficients, the filter coefficients are determined in response to monitored system disturbances.

Article of manufacture and computer program product corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF TOE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 presents major components of a typical Capacitive Voltage Transformer.

Figure 6:
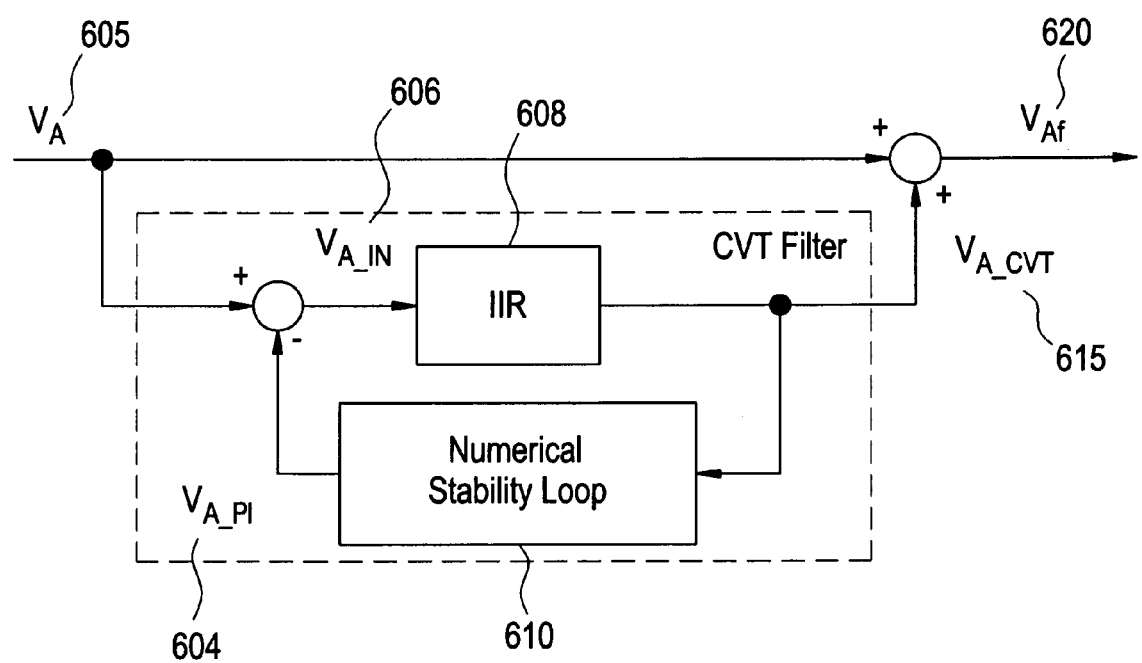

FIG. 6 presents the overall diagram of the voltage filter.

Figure 7:
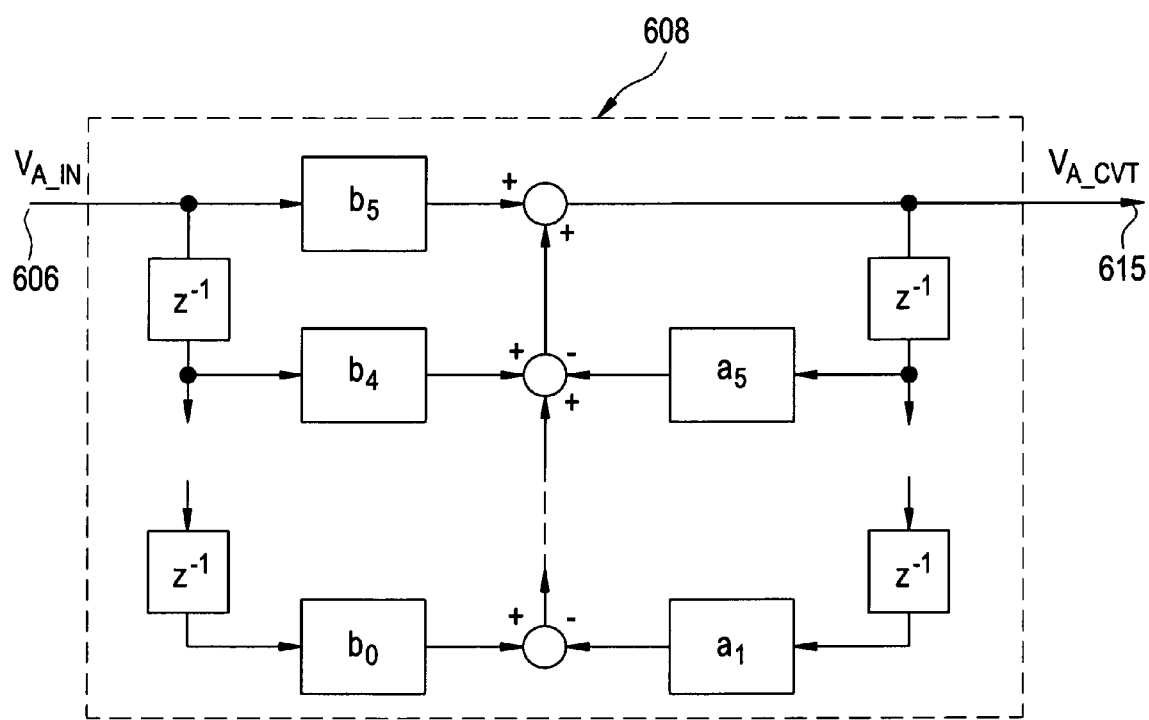

FIG. 7 presents the OR portion of the voltage filter.

Figure 8:
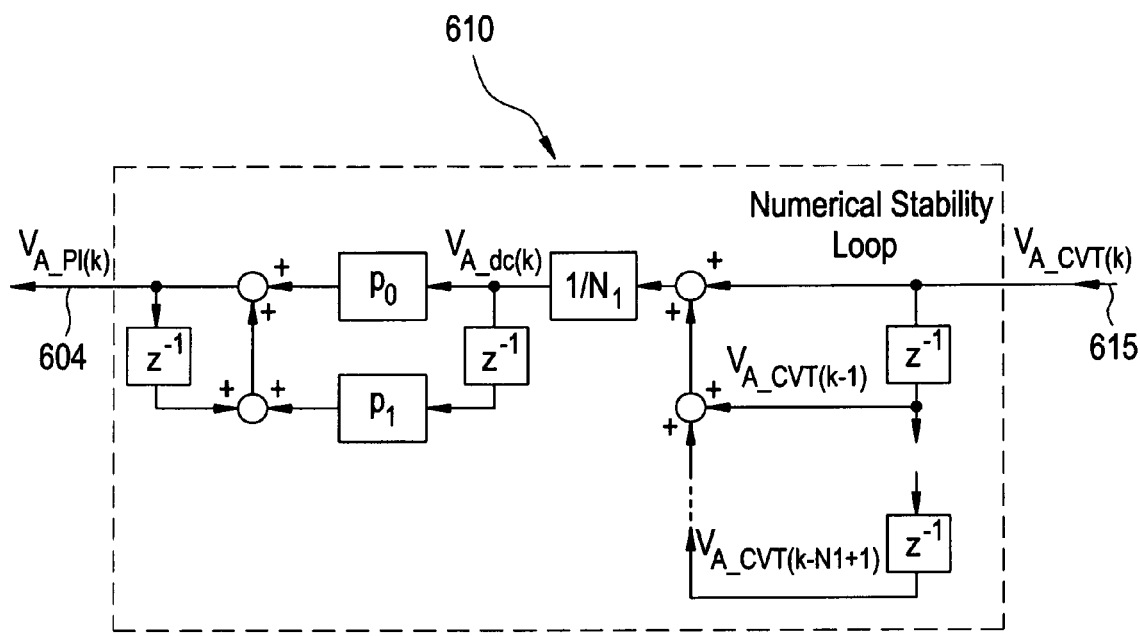

FIG. 8 presents the numerical stability portion of the voltage filter.

Figure 9:
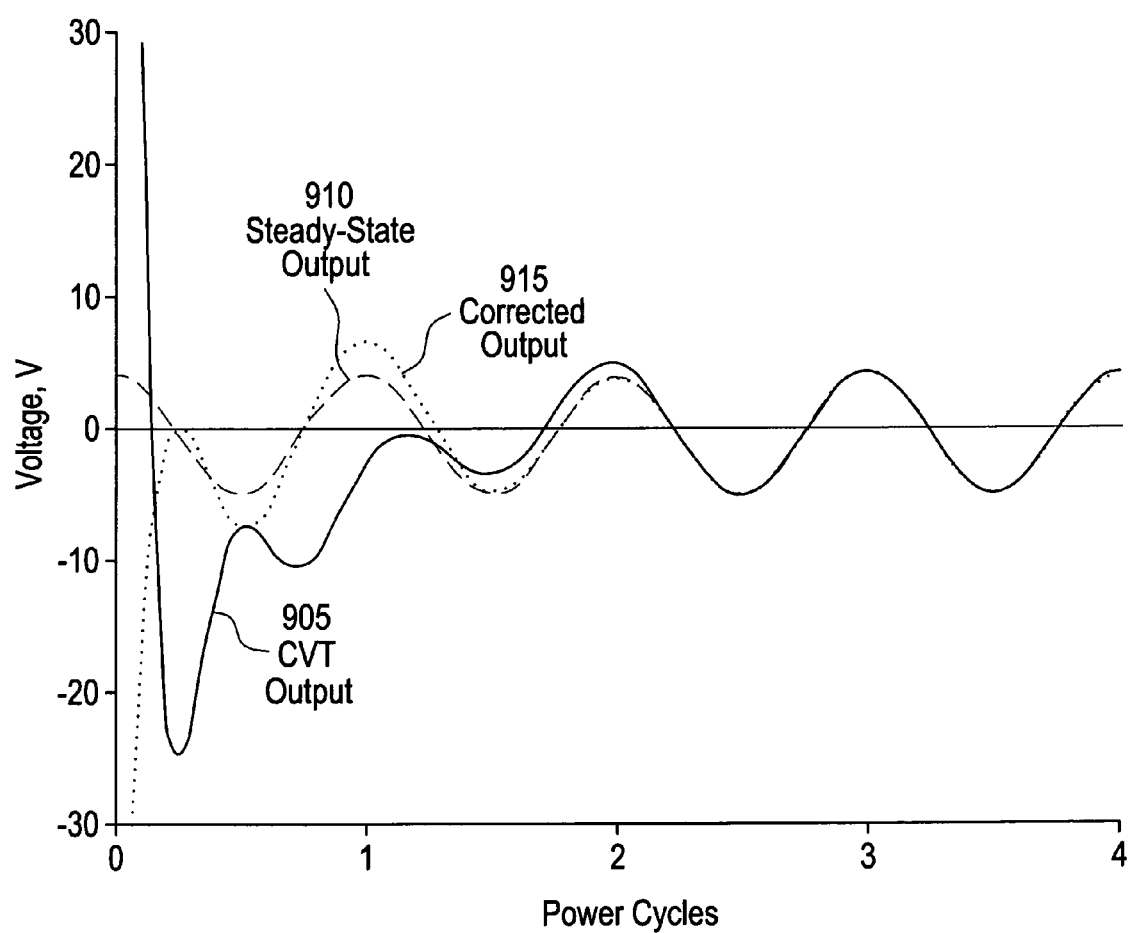

FIG. 9 illustrates the effectiveness of voltage filtering; line fault occurred at the peak of the voltage waveform.

Figure 10:
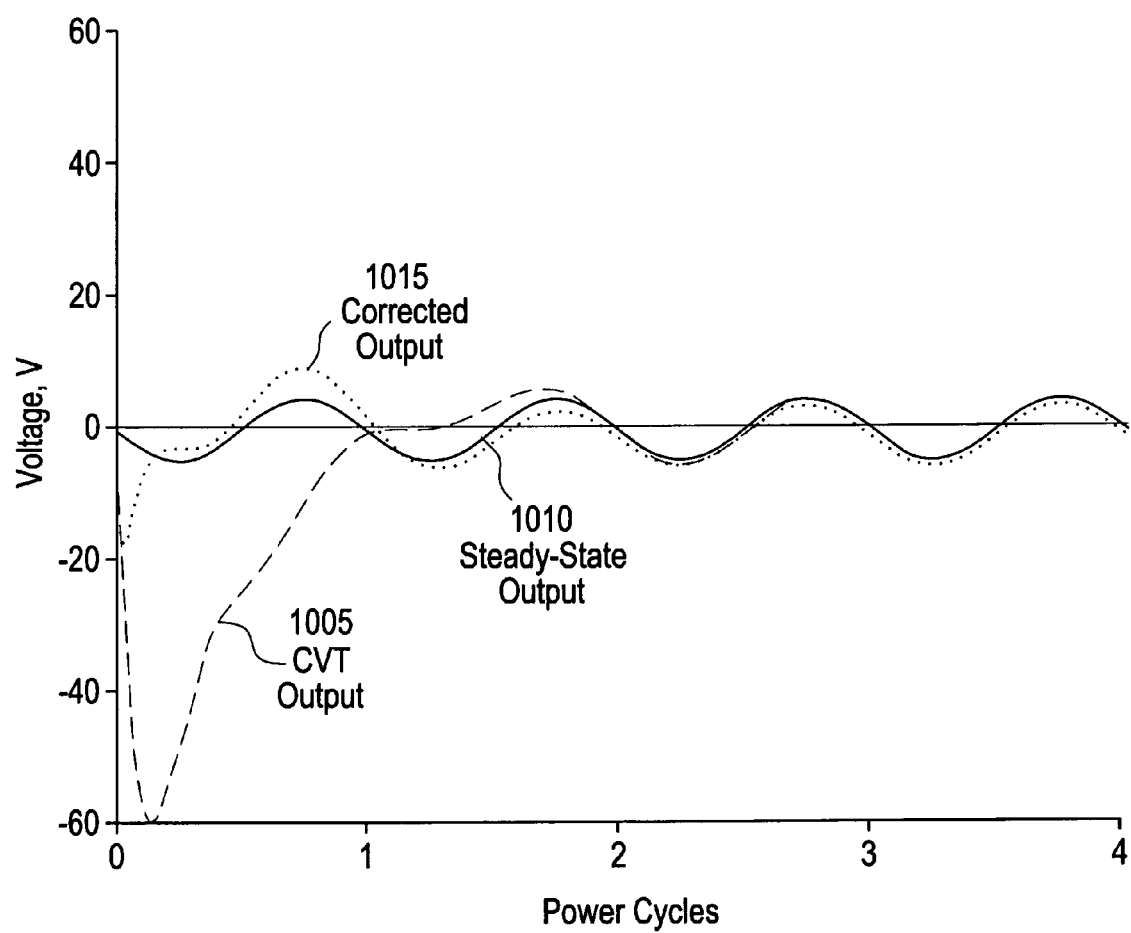

FIG. 10 illustrates the effectiveness of voltage filtering; line fault occurred at the zero crossing of the voltage waveform.

Figure 11:
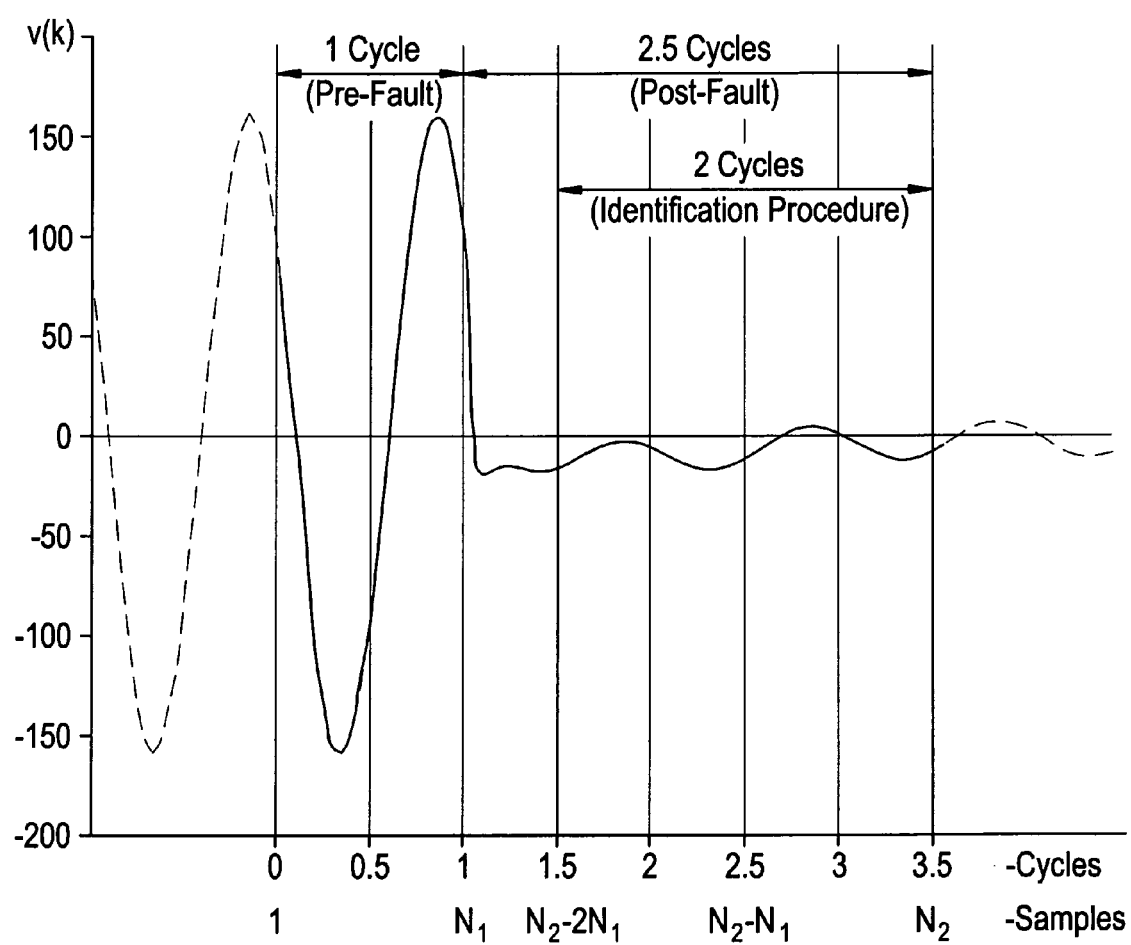

FIG. 11 presents data window selection for the self-tuning portion of the filter.

Figure 12:
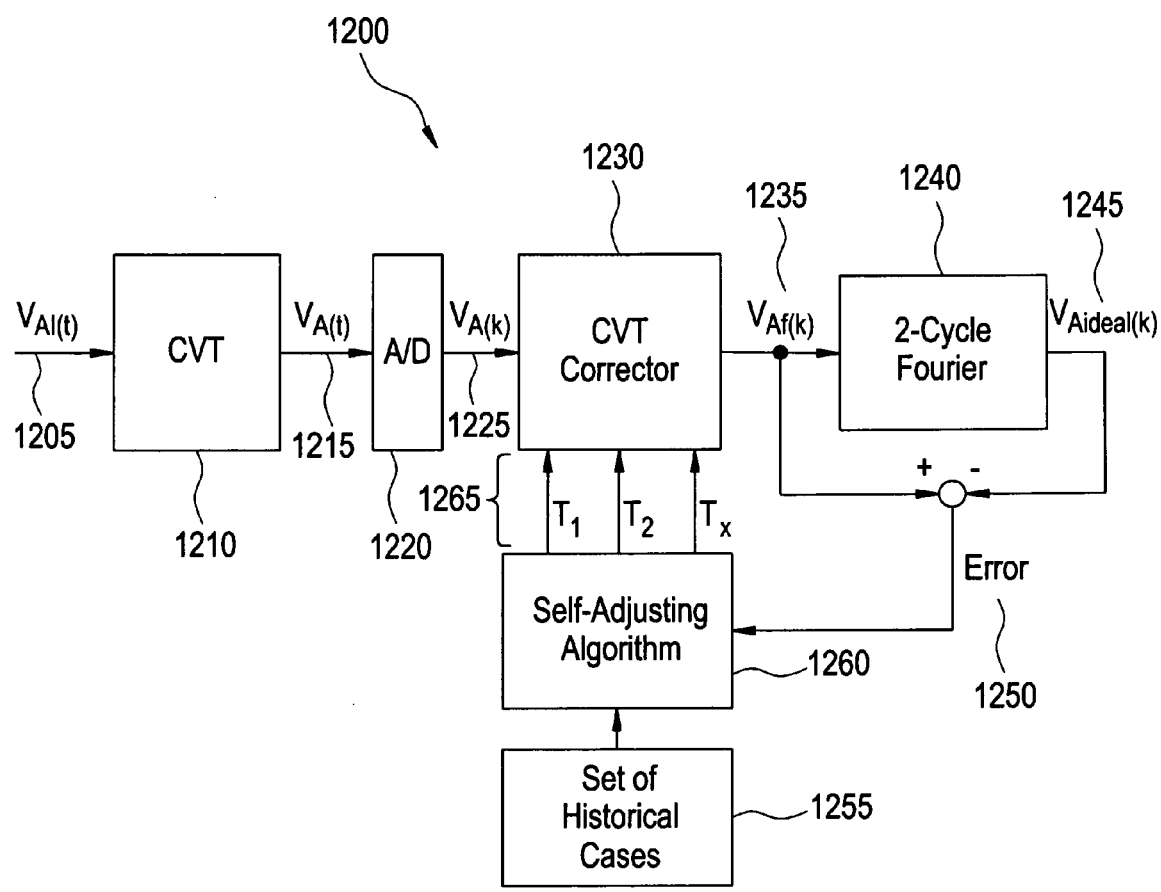

FIG. 12 presents the overall diagram of the self-tuning portion of the filter.

The detailed description explains the preferred embodiments of the invention, together with advantages and features, by way of example with reference to the drawings.

DETAILED DESCRIPTION OF THE INVENTION

One or more exemplary embodiments of the invention are described below in detail. The disclosed embodiments are intended to be illustrative only since numerous modifications and variations therein will be apparent to those of ordinary skill in the art.

Aspects of the present invention utilize common design and operation principles of a typical CVT to simplify the equivalent circuit diagram of the CVT to a three-parameter model. This means that the dynamic behavior of the CVT, including the significant transient components during fault conditions affecting response of protective relays, are characterized by three parameter model. Further, the three parameters are expressed as time constant.

Within further aspects of the present invention a digital infinite impulse Response (IIR) filter is designed to process the raw output from the CVT with the purpose to re-create the best possible replica of the true voltage signal measured by the CVT. The IIR filter is designed based on the three parameters of the CVT model. The IIR filter is implemented in a way that provides for both rejection of the major transient errors introduced by the CVT, and low-pass filtering that is otherwise beneficial for protection functions that utilize the filtered voltage signal. Additionally, the IIR filter incorporates mechanisms that will ensure the numerical stability of the filter.

Yet further aspects of the present invention cover a mechanism to self-tune the three parameters of the CVT during system faults, after the relay that incorporates the method is installed in the field. Every major change in the voltage signal generates transients associated with the CVT dynamic characteristic. As such these transients allow estimation of the CVT parameters. A self-adjusting technique is proposed to constantly modify the three parameters characterizing a given CVT to follow any changes in the CVT, and by doing so to adjust coefficients of the IIR filter in order to provide for optimum correction of the CVT output voltage.

Equivalent CVT Circuit Diagram

Figure 1:
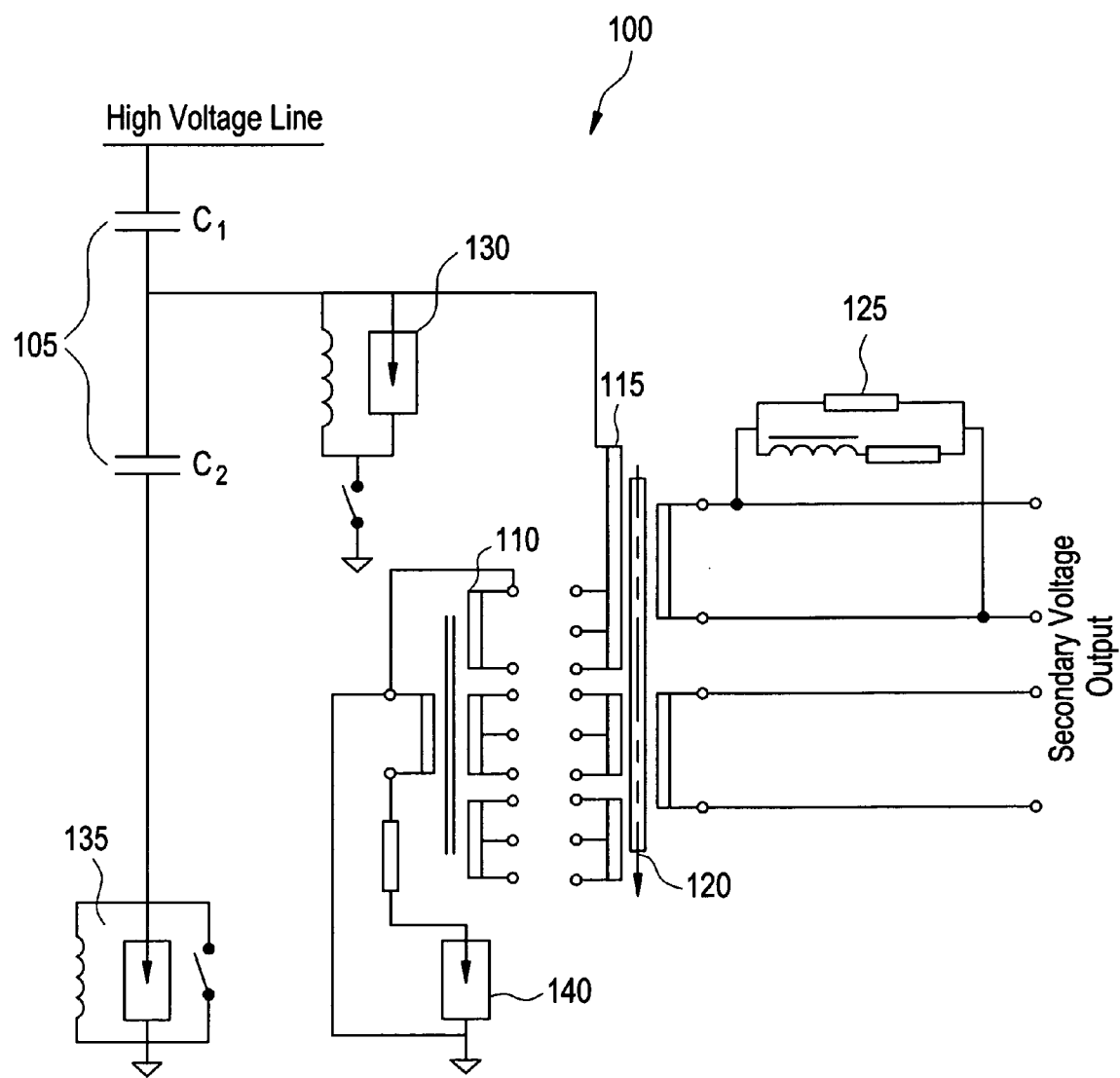

With reference to FIG. 1, a typical CVT 100 is illustrated, wherein the CVT 100 comprises a capacitive voltage divider 105 built on a stack of capacitors represented here by $C_1$ and $C_2$, a series reactor tuned to the total capacitance of the capacitive divider at the system nominal frequency 110, and a step down transformer 115 for reducing the intermediate voltage further down further incorporating a magnetic shield 120. The CVT 100 further comprises a ferrozonance suppression circuit 125, a choke, overvoltage protection gap and ground switch 130, a drain choke, protective gap and switch associated with the power line carrier equipment 135, and a reactor over voltage protective gap 140.

Figure 2:
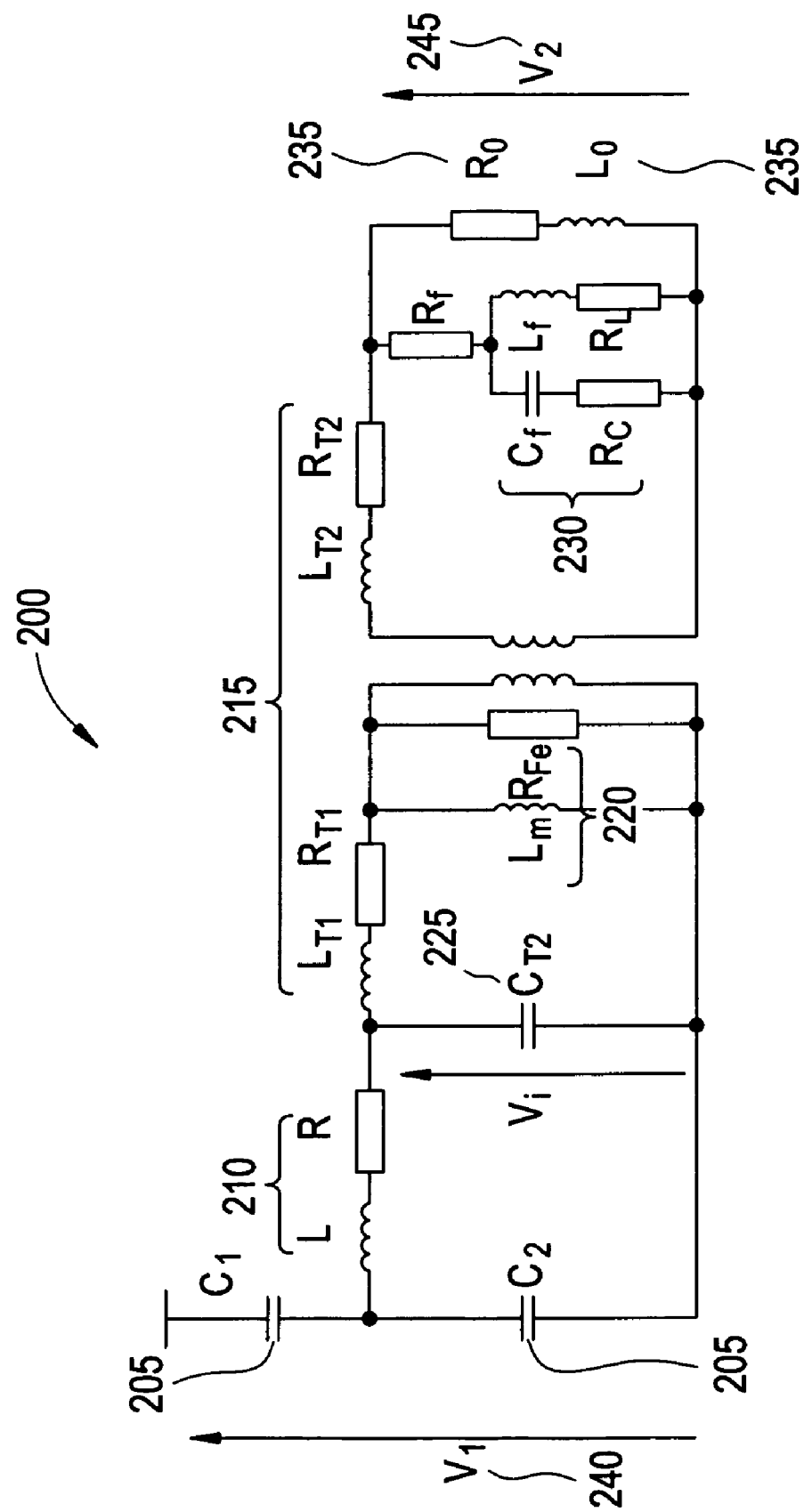
FIG. 2 shows a detailed equivalent circuit diagram derived for a CVT of typical construction.

FIG. 2 shows a detailed electrical equivalent 200 of the CVT 100. The capacitive divider 205 is represented by the $C_1$ and $C_2$ capacitance, the resistance (R) and inductance (L) represent the series reactor 210, the primary and secondary windings of the step down, transformer 215 are represented by resistances and inductances ($L_{T1}$, $R_{T1}$, $L_{T2}$ and $L_{T2}$). Further, the magnetic core 220 of the transformer is represented by the magnetic inductance ($L_m$) and resistance modeling magnetizing losses ($R_{Fe}$), and $C_{T2}$ represents natural capacitance 225 of the transformer winding.

The ferrorezonance suppression circuit 230 is represented by a resistor ($R_f$) in series with a parallel connection of a capacitor ($C_f$ and $R_C$) and inductor ($L_F$ and $R_L$). Additionally, $R_O$ and $L_O$ represent a burden 235 that potentially includes an internal burden resistor used when microprocessor based relays are supplied by the CVT creating a very small load compared with the nominal load assumed by the CVT designers. Parameters in the model of FIG. 2 are calculated to a common voltage base, typically taking the intermediate voltage, $v_i$, (transformer primary voltage) as a base, and rescaling the primary voltage ($v_1$) 240 and secondary voltage ($v_2$) 245 accordingly.

Simplified CVT Circuit Diagram

Many parameters in the detail model of FIG. 2 have very little impact on the dynamic response of the CVT 100. A number of assumptions can be made without diminishing the value of the equivalent diagram 300 as shown in FIG. 3.

In the equivalent diagram 300 the capacitance (C) 305 represents the sum of the $C_1$ and $C_2$ capacitor stacks, the inductance (L) 310 represents both the tuning reactor and the leakage inductance of the step down transformer. The resistance of the reactor and the transformer windings, the transformer capacitance and core magnetizing and losses; and the resistances of the capacitor in the ferroresonance circuit and the inductance can be neglected, leaving just $R_f$, $C_f$ and $L_f$ 315 to represent them. Further, the inductance in the burden can be neglected, at least for applications with modem relays, leaving just the equivalent burden resistance ($R_O$) 320-330. In the equivalent diagram 300 model of FIG. 3, the input is primary voltage scaled to the intermediate level ($v_1$) 320 and the output is the secondary voltage scaled to the intermediate level ($v_2$) 325. Simulation studies show that simplifications of FIG. 3, as compared with the more detailed model of FIG. 2, retain the major CVT performance characteristics from the point of view of protective relaying.

Figure 3:
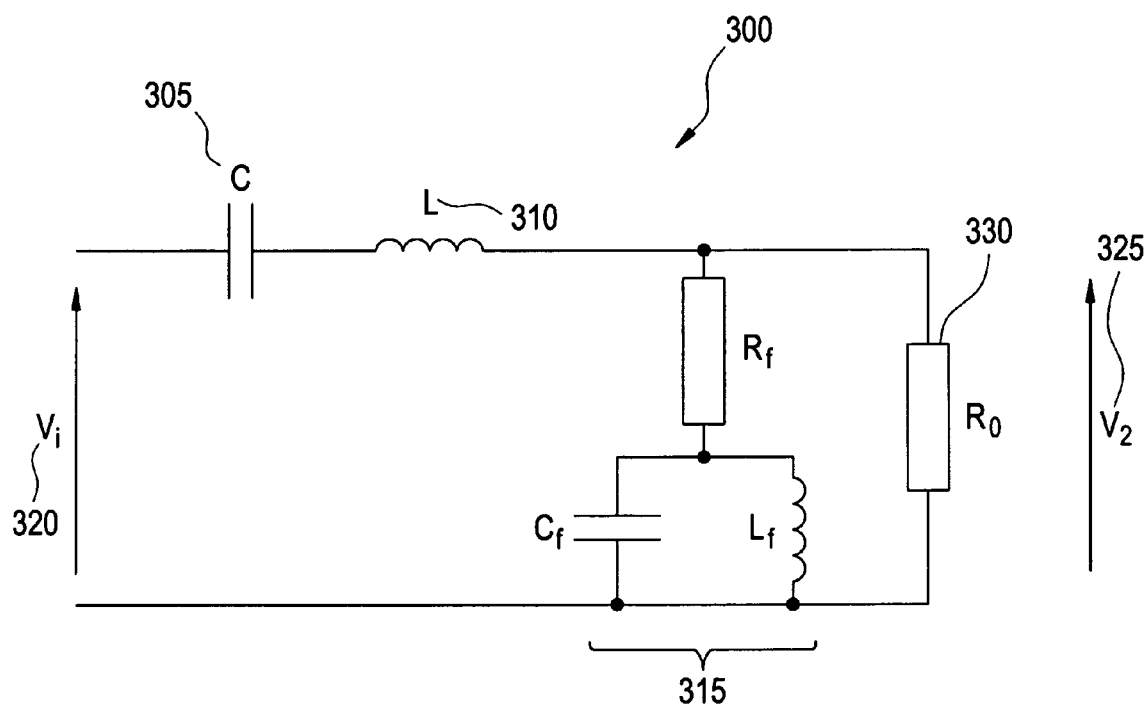
FIG. 3 shows a simplified equivalent logic diagram with components impacting most the transient response of a CVT.

The simplified CVT 100 circuit diagram 300 of FIG. 3 incorporates six unknowns, meaning six parameters are needed for predicting the performance of any specific CVT and for correcting any errors that may occur in the performance of the CVT device. However, CVTs are engineered to follow several specific rules. This reduces the number of degrees of freedom in the model of FIG. 3, and simplifies the equivalent diagram 300 model even further.

First, the tuning reactor is adjusted to compensate for the phase shift introduced by the capacitive divider. This is accomplished by tuning the value of L to resonate with C at the system fundamental frequency ($f_1$). Therefore, L and C are not independent but satisfy the following boundary equation:

$$L \cdot C \cdot \omega_1^2 = 1 \qquad \text{(Eq. 1)}$$

Where the system radian frequency is defined as:

$$\omega_1 = 2 \pi f_1 \qquad \text{(Eq. 2)}$$

Similarly, the ferroresonance suppression circuit is tuned to engage the series resistor $R_f$ only at frequencies different than the fundamental frequency. Therefore the parallel connection of $L_f$ and $C_f$ is an open circuit at the fundamental frequency, yielding the second boundary equation;

$$L_f C_f \omega_1^2 = 1 \qquad \text{(Eq. 3)}$$

A transfer function can be found for the circuit 300 of FIG. 3. This transfer function simplifies further when using the boundary Equations 1 and 3:

$$G_{CVT(x)} = \frac{V_{2(x)}}{V_{1(x)}} \quad \text{(Eq. 4)}$$

$$= \frac{1}{1 + T_X \cdot \frac{s^2 + \frac{1}{T_1}s + \omega_1^2}{s^2 + \frac{1}{T_2}s + \omega_1^2} \cdot \frac{s^2 + \omega_1^2}{s}}$$

Where "s" is the Laplace operator, and the three parameters of the model are defined as follows:

$$T_1 = C_f \cdot (R_0 + R_f) \quad \text{(Eq. 5)}$$

$$T_2 = C_f \cdot (R_f) \quad \text{(Eq. 6)}$$

$$T_X = L \cdot \left(\frac{R_0 + R_f}{R_0 \cdot R_f}\right) \quad \text{(Eq. 7)}$$

Equations 5 through 7 explain that the performance of the CVT 300 of FIG. 3 is not controlled by each parameter individually, but it is certain products of differing parameters that control the performance of the CVT 300. As a result of the boundary conditions (Equation 1) and (Equation 3) and the relationships of Equations 5 through 7, a typical CVT can be represented by three parameters. Further, these three parameters can be tracked back to the construction of the CVT as per Equations 5 through 7. Within aspects of the present invention these parameters are automatically recovered from the observed secondary voltage in the process of self-tuning.

Digital Filter Correcting for CVT Transients

Figure 4:
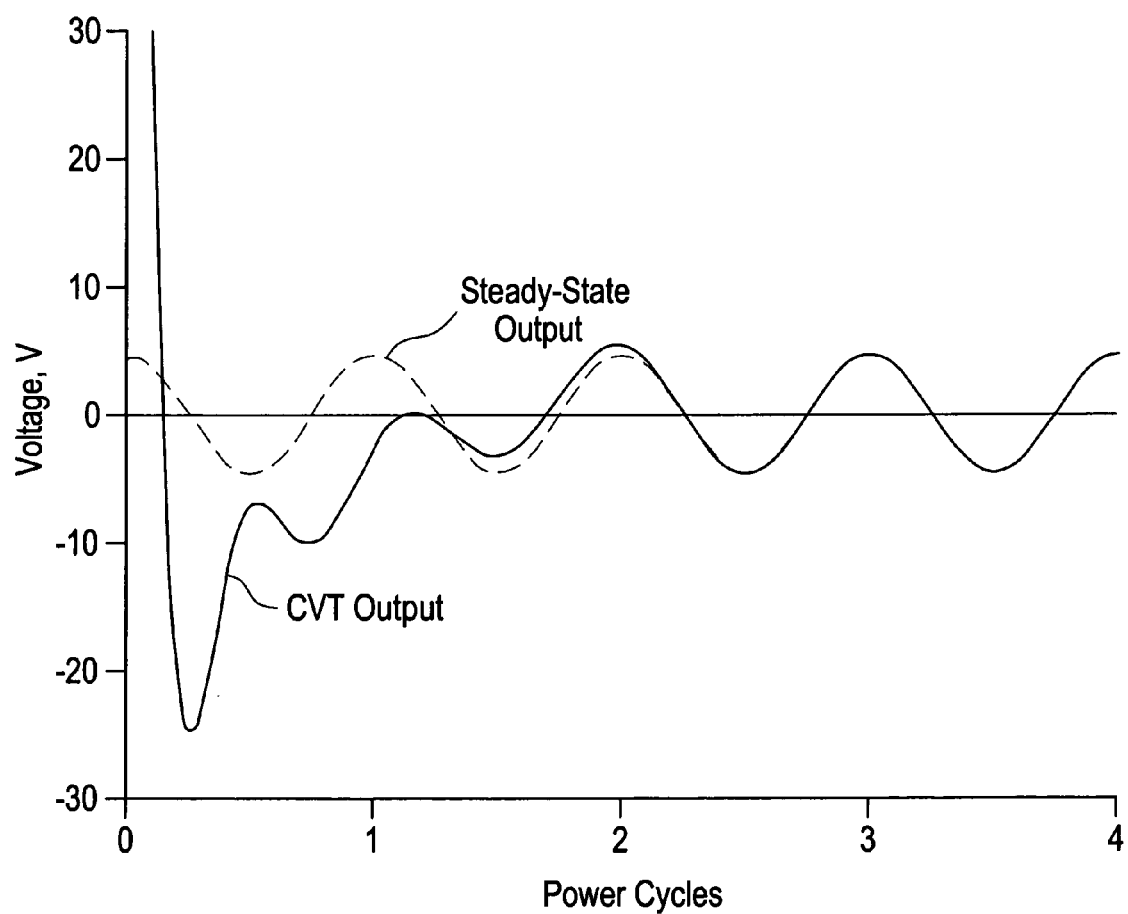
FIG. 4 depicts the impact of CVT transients on the transient accuracy of the voltage measurement; line fault occurred at the peak of the voltage waveform.

FIG. 4 illustrates a sample response of a CVT under fault conditions. A fault causing a sudden drop of the voltage occurred when the high voltage waveform was at the peak value. The dashed line represents a true value of the signal while the solid line represents the output of a CVT. Significant transient errors occur in the first 2-3 cycles of power frequency, to the extent than even the polarity of the CVT output signal is inverted as compared with the actual voltage signal.

Figure 5:
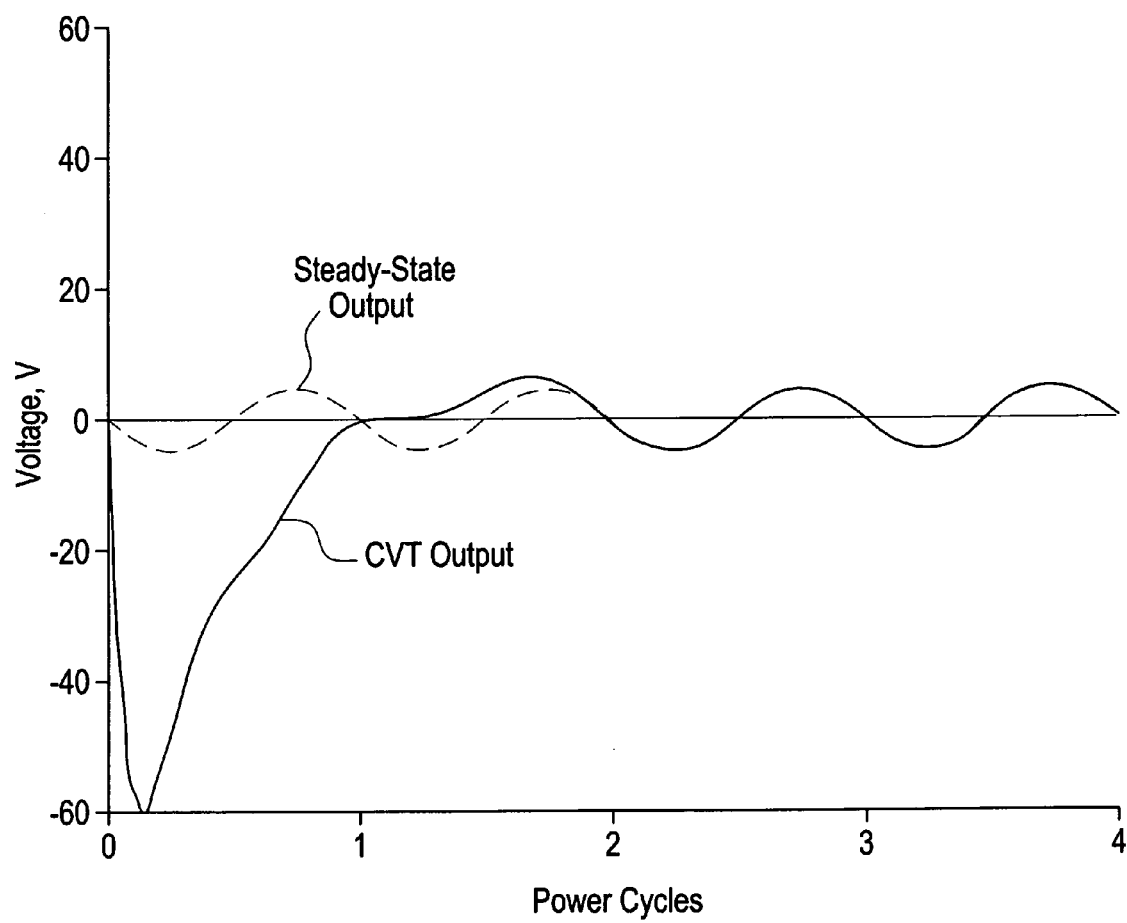
FIG. 5 depicts the impact of CVT transients on the transient accuracy of the voltage measurement; line fault occurred at the zero crossing of the voltage waveform.

FIG. 5 presents a similar case, but for the fault occurring when the voltage waveform crosses zero. In this case even higher errors occur. For example, about 0.2 cycles into the fault, the real voltage is about –5V or so while the CVT output voltage is almost –60V. Such tenfold differences lasting for 1-2 power cycles create serious problems to protective relays.

It must be noted that the nature of the transient errors differs between FIGS. 4 and 5. This is because the dynamic of the circuit of FIG. 2 or 3 is different depending on the moment of fault. However the transient function Equation 4 contains foil information as to the nature of the transients given the conditions prior to the fault and voltage collapse. Therefore, this transfer function can be used to "invert" the transient process and correct for all possible errors patterns.

This correction can be accomplished as either a multiplicative or additive correction. The former processes the output voltage of the CVT using a liner filter which output is the corrected primary voltage of interest. The latter processes the output voltage of the CVT using a different liner filter which output is added to the raw output of the CVT to obtain the corrected primary voltage of interest.

With reference to FIG. 6 the method of this disclosure produces the filtered (corrected for CVT transients) voltage $v_{Af}$ 620 based on the raw output of the CVT labeled here as $V_A$ 605. The index A refers to the first phase in a three-phase system (ABC). Identical processing is used in the two remaining phases B and C. The corrected voltage is obtained as a sum of the raw voltage and a dynamic correcting value:

$$v_{Af} = v_A + v_{A\_CVT} \quad \text{(Eq. 8)}$$

The correction is zero during steady state conditions, and assumes values counterbalancing the CVT errors during transient conditions. The correcting signal $v_{A\_CVT}$ is calculated as an output of a filter having the transfer function as follows;

$$G_{COR1(s)} = T_X \cdot \frac{s^2 + \frac{1}{T_1}s + \omega_1^2}{s^2 + \frac{1}{T_2}s + \omega_1^2} \cdot \frac{s^2 + \omega_1^2}{s} \quad \text{(Eq. 9)}$$

The transfer function of Equation 9 is fed with the raw output of the CVT augmented with an extra signal introduced to ensure numerical stability of the implementation:

$$v_{A\_IN} = v_A - V_{API} \quad \text{(Eq. 10)}$$

The concern of numerical stability arises from the nature of the primary filter given by Equation 9, this filter is only asymptotically stable—having a pole of zero (0). In other words correcting a CVT using the filter of Equation 9 requires integration. Integrators, numerical or analog, have the tendency of becoming unstable due to finite accuracy of calculations or involved circuitry. A practical implementation must ensure no numerical stability problems can ever occur.

Within aspects of the present invention, the extra signal subtracted from the input of the filter per Equation 10 is produced by a Proportional-Integral (PI) controller taking into account the fact that (under steady state conditions) the correcting signal, should be zero. The PI control loop 610 of FIG. 6 ensures that the output 615 of the CVT filter is forced to remain at zero on average regardless of numerical accuracy or other potential problems.

A further issue that must be resolved is that fact that the correcting transfer function (Equation 9) has its numerator of the $4^{th}$ order, and its denominator of the $3^{rd}$ order. This is understandable given the primary design target of reproducing the input signal to a CVT from the output of a CVT, but would amplify high frequency components injected into the output CVT signal (e.g., via coupling, numerical noise, etc.). This result is not desired. Within aspects of the present invention the ideal correcting transfer function (Equation 9) is modified by adding a low-pass filter. The low pass filter in one particular implementation is a second order Butterworth filter:

$$G_{COR2(x)} = T_X \cdot \frac{s^2 + \frac{1}{T_1}s + \omega_1^2}{s^2 + \frac{1}{T_2}s + \omega_1^2} \cdot \quad \text{(Eq. 11)}$$

$$\frac{s^2 + \omega_1^2}{s} \cdot \frac{1}{\left(\frac{s}{\omega_C}\right)^2 + \sqrt{2} \cdot \left(\frac{s}{\omega_C}\right) + 1}$$

Where the cut-off frequency of the low-pass filter, $f_C$, is set depending on the application for the corrected voltage, typically in the order of few hundred Hz. The radian cut off frequency in Equation 11 is:

$$\omega_C = 2\pi f_C \quad \text{(Eq. 11)}$$

Another step is taken to avoid stability problems. Without any significant impact on the performance the zero pole of the transfer function (Equations 9 or 11) is moved from zero (0) toward a stable position, using an arbitrary design parameter $\alpha$, yielding the following CVT filter transfer function for implementations of FIG. 6:

$$G_{COR3(x)} = T_X \cdot \frac{s^2 + \frac{1}{T_1}s + \omega_1^2}{s^2 + \frac{1}{T_2}s + \omega_1^2} \cdot \frac{s^2 + \omega_1^2}{s + \alpha} \cdot \frac{1}{\left(\frac{s}{\omega_C}\right)^2 + \sqrt{2}\cdot\left(\frac{s}{\omega_C}\right) + 1} \quad \text{(Eq. 12)}$$

In the filter of Equation 12 the system nominal frequency ($\omega_1$) and the design parameters ($\alpha$ and $\omega_C$) are known, while the CVT characteristic defined by the three degrees of freedom of the model ($T_X$, $T_1$ and $T_2$) are treated as unknowns. We use a self-tuning method to recover the three unknowns for any particular CVT in order to enable the matched filter from the family of possible filters having the general format of Equation 12.

Initially, to allow implementation in a digital apparatus, the continuous-time domain solution (Equation 12) must be converted into numerical implementation. Those of ordinary skid in digital signal processing can easily perform this step. A particular implementation utilizes the following implementation equations:

The output signal 615 from the IIR filter at the digital sample time k is calculated as;

$$v_{A\_CVT(k)} = \sum_{i=0}^{s} b_i \cdot v_{A\_IN(k-s+i)} - \sum_{i=1}^{s} a_i \cdot v_{A\_CVT(k-s+i)} \quad \text{(Eq. 13)}$$

Coefficients of the filter are:

Recursive Part $$a_1 = \frac{1}{p_D}(-1 + h_1 - h_2 + h_3 - h_4) \quad \text{(Eq. 14a)}$$

$$a_2 = \frac{1}{p_D}(5 - 3h_1 + h_2 + h_3 - 3h_4) \quad \text{(Eq. 14b)}$$

$$a_3 = \frac{2}{p_D}(-5 + h_1 + h_2 - h_3 - h_4) \quad \text{(Eq. 14c)}$$

$$a_4 = \frac{2}{p_D}(5 + h_1 - h_2 - h_3 + h_4) \quad \text{(Eq. 14d)}$$

$$a_5 = \frac{1}{p_D}(-5 - 3h_1 - h_2 + h_3 + 3h_4) \quad \text{(Eq. 14e)}$$

where:

$$p_D = 1 + h_1 + h_2 + h_3 + h_4 \quad \text{(Eq. 15a)}$$

-continued $$h_1 = r\cdot\left(\frac{1}{\omega_1 T_2} + \sqrt{2}\,k_{fc}\right) \quad \text{(Eq. 15b)}$$

$$h_2 = r^2\left(1 + k_{fc}\left(\frac{\sqrt{2}}{\omega_1 T_2} + k_{fc}\right)\right) \quad \text{(Eq. 15c)}$$

$$h_3 = r^3 \cdot k_{fc}\left(\frac{k_{fc}}{\omega_1 T_2} + \sqrt{2}\right) \quad \text{(Eq. 15d)}$$

$$h_4 = r^4 \cdot k_{fc}^2 \quad \text{(Eq. 15e)}$$

$$r = \tan\left(\frac{\pi}{N_1}\right) \quad \text{(Eq. 15f)}$$

$$k_{fc} = \frac{2\cdot\pi\cdot f_c}{\omega_1} \quad \text{(Eq. 15g)}$$

Non-Recursive Part $$b_0 = g_1 - g_2 + g_3 - g_4 + g_5 \quad \text{(Eq. 16a)}$$

$$b_1 = 5g_1 - 3g_2 + g_3 + g_4 - 3g_5 \quad \text{(Eq. 16b)}$$

$$b_2 = 2(5g_1 - g_2 - g_3 + g_4 + g_5) \quad \text{(Eq. 16c)}$$

$$b_3 = 2(5g_1 + g_2 - g_3 - g_4 + g_5) \quad \text{(Eq. 16d)}$$

$$b_4 = 5g_1 + 3g_2 + g_3 - g_4 - 3g_5 \quad \text{(Eq. 16e)}$$

$$b_5 = g_1 + g_2 + g_3 + g_4 + g_5 \quad \text{(Eq. 16f)}$$

where:

$$g_1 = p_G \omega_1 r^3 \quad \text{(Eq. 17a)}$$

$$g_2 = p_G \frac{r^2}{T_1} \quad \text{(Eq. 17b)}$$

$$g_3 = 2 p_G \omega_1 r \quad \text{(Eq. 17c)}$$

$$g_4 = p_G \frac{1}{T_1} \quad \text{(Eq. 17d)}$$

$$g_5 = p_G \frac{\omega_1}{r} \quad \text{(Eq. 17e)}$$

$$p_G = \frac{T_x k_{fc}^2 r^2}{p_D} \quad \text{(Eq. 17f)}$$

FIG. 7 illustrates the implementation of the IIR filter 608 per Equations 13 through 17. The $z^{-1}$ operator denotes time delay by one sample period. The PI controller 610 completes the implementation. First, a dc component in the filter's 608 output voltage 615 is calculated. This signal 615 is the input to the PI controller:

$$V_{A\_dc(k)} = \frac{1}{N_1}\sum_{i=0}^{N_1-1} v_{A\_CVT(k-i)} \quad \text{(Eq. 18)}$$

Where $N_1$ is a number of samples in one power cycle.

During steady state conditions this value shall be close to zero as no additive correction is required or produced by the CVT filter. Even under small errors the value of Equation (18) will be close to zero as all the signals are cyclic waveforms and will average out in a one-cycle sum.

Assuming the stability control loop is run every $N_{Pj}$ power cycles, the correcting signal, $V_{A\_PI}$ is calculated as follows;

$$V_{A\_PI(j)} = V_{A\_PI(j-1)} + p_{PI\_0} \cdot V_{A\_dc(j)} + p_{PI\_1} \cdot V_{A\_dc(j-1)}$$

Where j is an index for the sampling process of the controller (j is a pointer to time moments spaced $N_{PI}$ power system cycles apart), and:

$$p_{PI\_0} = g_I + g_P \quad \text{(Eq. 19b)}$$

$$p_{PI\_1} = g_I - g_P \quad \text{(Eq. 19c)}$$

In one particular implementation the gains are selected as follows;

$$g_I = \frac{N_{PI} \cdot \pi}{T_x \cdot T_{PI}^2 \cdot \omega_1^3} \quad \text{(Eq. 19d)}$$

$$g_P = \frac{2}{T_x \cdot T_{PI} \cdot \omega_1^2} \quad \text{(Eq. 19e)}$$

FIG. 8 illustrates the process of calculating the output 604 of the PI controller 610.

FIGS. 9 and 10 present graphs detailing the impact of the CVT corrector for faults at maximum and zero crossing, respectively. The solid lines stand for raw CVT output voltages (905, 1005), the dashed lines are ideal voltages representing the faults (910, 1010), and the dotted lines are corrected CVT voltages (915, 1015). It can be seen that the dotted lines representing the corrected CVT outputs (915, 1015) match the solid lines representing the ideal signal (910, 1010) by the order of magnitude better compared with the raw CVT output (905, 1005). In particular, the polarity and zero crossings are much better represented allowing improved applications of the voltage signal for fast protection applications.

As mentioned above, in order to accomplish the CVT correction one needs to use the correct values of the three parameters in the model ($T_X$, $T_1$ and $T_2$), these parameters are self-adjusting as explained below.

Self-Adjusting Parameters

The general concept of self-adjusting parameters relies on system events to generate CVT transients. In a general system identification theory one needs both input and output of a given system in order to identify its transfer function, parameters or other equivalent system description. In the case of a CVT the input (primary) voltage cannot be measured for the CVT identification purposes. However, this voltage may be reasonably well approximated for several event types. These events are:

Energizing of a transmission line with CVTs installed on the line-side of the circuit breaker. In this case the pre-event voltage is zero, and the post-event voltage can be approximated from the steady state output voltage of the CVT projected back in time to the line switching moment.

De-energizing of a transmission line with CVTs installed on the line-side of the circuit breaker. In this case the pre-event voltage is the directly measured steady state CVT output voltage, and the post-event voltage is zero—at least in terms of the fundamental frequency component. On long lines with shunt reactors this category cannot be easily used for CVT identification due to large and long lasting transients in the high voltage caused by the discharge of line capacitances and shunt reactors.

Close-in faults depressing the high voltage to low and stable values. This category of events can be used after careful analysis of the post-event voltage to make sure the assumptions about the primary CVT voltage are true.

In any case an ideal CVT output voltage can be found in a number of transients that happen after the device implementing our method is installed. A number of security conditions can be applied in order to make sure the selected case is secure enough to be used, that is, the assumptions as to the ideal output are true with, reasonable certainty. FIG. 11 presents a sample transient that can be used for sell-adjusting of the algorithm. A two-power-cycle period between 0.5 cycle and 2.5 cycle is selected for tuning the filter. The first 0.5 cycle is rejected as having extra transients associated with the primary voltage. The window is closed at 2.5 cycles assuming a system fault may be cleared soon afterwards generating new transients related to clearing the fault. During the 2 cycles in-between the true CVT voltage is known with reasonable accuracy. This voltage can be well approximated with the use the Fourier transform with the window of 2 cycles. The well-known Fourier algorithm allows estimating the fundamental frequency component in the true CVT voltage, rejecting other high frequency components in this signal. This is sufficient, or even beneficial when matching the response of our CVT filter as the latter works as a low-pass filter per Equation 12.

After obtaining the Fourier estimate of the secondary CVT voltage, this estimate is used as representation of the true CVT signal, and a pure sine wave is generated based, on the magnitude and angle information from the Fourier estimator. Next, a difference signal is calculated between the corrected CVT output and the ideal CVT output. If the three CVT parameters used to design the CVT corrector are perfect, the match is very good. If the parameters used do not reflect the dynamics of the specific CVT, there is a mismatch between the ideal and corrected CVT signals.

FIG. 12 presents a simplified block diagram of the self-adjusting algorithm 1200. First, the actual CVT 1210 responds to its primary (input) voltage $v_{A1}$ 1205 generating the output voltage $v_A$ 1215. The latter signal is digitized via an Analog-to-Digital (A/D) converter 1220. Next, a correcting algorithm 1230 (described above) is executed yielding the corrected output $v_{Af}$ 1235. This signal is now processed using a traditional 2-cycle Fourier transform 1240. Based on the estimated phasor an ideal voltage waveform is generated, $v_{Aideal}$ 1245. Next, subtracting the corrected CVT voltage and the ideal CVT voltage 1250 produces the error signal. The error is a function of the CVT parameters used to design the CVT corrector ($T_X$, $T_1$ and $T_2$) 1265. The error signal is an input to the optimization routine (1255, 1260) that adjusts the three parameters to minimize the error. The set of the three parameters minimizing the error for a given system event is the sought solution (subject to further checks and post-processing as described later).

One solution to the optimization problem is described below, it is desired to estimate the three unknown parameters of the model:

$$T = \begin{bmatrix} T_S \\ T_1 \\ T_2 \end{bmatrix} \quad \text{(Eq. 20)}$$

One approach is to simply search the three-dimensional parameter space for a best fit between the model and the observed waveforms during system events.

Let us denote:

$t_k$; duration of the k-th system event (such as 2 cycles)

$y_k(t)=v_{Aideal}(t)$ ideal CVT output for the k-th case estimated using the Fourier transform $\hat{y}_k(t, T)=v_{Af}(t)$ estimated CVT output for the k-th case using the value of T for the CVT filter For each ease and with a given set of parameters, we can simulate the combination of the CVT and the correction algorithm to arrive at an estimated waveform that purports to approximate the ideal.

We would like to select values of the unknown parameters that minimize the integrated square of the difference between the ideal and actual waveforms. Formally, we wish to minimise the following square error:

$$ERROR^2(T) = \sum_{k=1}^{M} \int_0^{t_R} (y_k(t) - \hat{y}_k(t:T))^2 dt \quad \text{(Eq. 21)}$$

Equation 21 is implemented by first integrating the square of the difference between the ideal and the estimated waveforms, and then summing over all of the available eases. The result is representative of the square of the mismatch for a particular set of model parameters.

There are a several of ways of using Equation 21 to locate the best fit. They both start out the same way, by doing a brute-force global search over a discrete three-dimensional grid that spans the range of possible parameter values, evaluating (Equation 21) for each set of parameters, and down selecting the set with the smallest value of squared error. The grid could be rather coarse, on the order often (10) values for each parameter, for a total of 1000 points to be evaluated. The result of the coarse search would be a point that is reasonably close to the optimum, and could be used as the starting point for a more accurate, estimate, which could be done by either using a refined grid, or by using calculus.

In the refined grid approach, a sub-grid is formed by subdividing the eight (8) cubes of the original grid that are adjacent to the point identified by the first search, and the search is then repeated on that grid. The refined grid approach can be applied repeatedly to zoom-in as much as desired.

The other approach is to use calculus to utilize the properties of Equation 21 to compute an adjustment to the point identified by the coarse search.

At the optimum fit $T_0$, the gradient of the squared error is zero:

$$\nabla ERROR^2(T_0) = \begin{bmatrix} 0 \\ 0 \\ 0 \end{bmatrix} \quad \text{(Eq. 22)}$$

$$\nabla ERROR^2 = \begin{bmatrix} \frac{\partial ERROR^2}{\partial T_X} \\ \frac{\partial ERROR^2}{\partial T_1} \\ \frac{\partial ERROR^2}{\partial T_2} \end{bmatrix}$$

Substituting Equation 21 into Equation 22 we find a basis for a solution:

$$\begin{bmatrix} 0 \\ 0 \\ 0 \end{bmatrix} = \sum_{k=1}^{M} \int_0^{t_R} (y_k(t) - \hat{y}_k(t:T_0)) \cdot \nabla \hat{y}_k(t:T_0) \cdot dt \quad \text{(Eq. 23)}$$

We start by noting that after the coarse search we have quantities that are close to those that appear in Equation 23. We can use a Taylor's expansion to bridge the small gap. We will need estimates for both the waveforms and their gradients with respect to the model parameters, using what we have at a nearby grid point;

$\hat{y}_k(t; T_z)$=estimated CVT input voltage for the k'th case with $T_z$ $\nabla \hat{y}_k(t; T_z)$=gradient of the CVT input voltage for the k'th case with $T_z$ $$\nabla \hat{y}_k(t:T_a) = \begin{bmatrix} \frac{\partial \hat{y}_k(t:T_a)}{\partial T_X} \\ \frac{\partial \hat{y}_k(t:T_a)}{\partial T_1} \\ \frac{\partial \hat{y}_k(t:T_a)}{\partial T_2} \end{bmatrix} \quad \text{(Eq. 24)}$$

$$T_a = \begin{bmatrix} T_X(l) \\ T_1(m) \\ T_2(n) \end{bmatrix}$$

l, m, n indices of the near-optimal grid point

We need to compute a correction to our near-optimal grid point to find the true optimum:

$$T_0 = T_z + \Delta T \quad \text{(Eq. 25)}$$

This can be done by using a Taylor's expansion around the available grid point.

$$\hat{y}_k(t:T_0) \approx \hat{y}_k(t:T_x) + (\nabla \hat{y}_k(t:T_x))^t \cdot \Delta T \quad \text{(Eq. 26)}$$

$$\nabla \hat{y}_k(t:T_0) \approx \nabla \hat{y}_k(t:T_x)$$

$$(\nabla \hat{y}_k(t:T_x))^t = \text{transpose of } \nabla \hat{y}_k(t:T_x)$$

$$= \begin{bmatrix} \frac{\partial \hat{y}_k(t:T_x)}{\partial T_X} & \frac{\partial \hat{y}_k(t:T_x)}{\partial T_1} & \frac{\partial \hat{y}_k(t:T_x)}{\partial T_2} \end{bmatrix}$$

Substituting Equation 26 into Equation 23 we find that:

$$H \cdot \begin{bmatrix} \Delta T_X \\ \Delta T_1 \\ \Delta T_2 \end{bmatrix} = \begin{bmatrix} \sum_{k=1}^{M} \int_0^{t_R} (y_k(t) - \hat{y}_k(t:T_x)) \cdot \frac{\partial \hat{y}_k(t:T_x)}{\partial T_X} \cdot dt \\ \sum_{k=1}^{M} \int_0^{t_R} (y_k(t) - \hat{y}_k(t:T_x)) \cdot \frac{\partial \hat{y}_k(t:T_x)}{\partial T_1} \cdot dt \\ \sum_{k=1}^{M} \int_0^{t_R} (y_k(t) - \hat{y}_k(t:T_x)) \cdot \frac{\partial \hat{y}_k(t:T_x)}{\partial T_2} \cdot dt \end{bmatrix} \quad \text{(Eq. 27)}$$

Where the H matrix is given by:

$$H = \sum_{k=1}^{M} \int_0^{t_R} dt \begin{bmatrix} \frac{\partial \hat{y}_k(t:T_x)}{\partial T_X} \cdot \frac{\partial \hat{y}_k(t:T_x)}{\partial T_X} & \frac{\partial \hat{y}_k(t:T_x)}{\partial T_X} \cdot \frac{\partial \hat{y}_k(t:T_x)}{\partial T_1} & \frac{\partial \hat{y}_k(t:T_x)}{\partial T_X} \cdot \frac{\partial \hat{y}_k(t:T_x)}{\partial T_2} \\ \frac{\partial \hat{y}_k(t:T_x)}{\partial T_X} \cdot \frac{\partial \hat{y}_k(t:T_x)}{\partial T_1} & \frac{\partial \hat{y}_k(t:T_x)}{\partial T_1} \cdot \frac{\partial \hat{y}_k(t:T_x)}{\partial T_1} & \frac{\partial \hat{y}_k(t:T_x)}{\partial T_1} \cdot \frac{\partial \hat{y}_k(t:T_x)}{\partial T_2} \\ \frac{\partial \hat{y}_k(t:T_x)}{\partial T_X} \cdot \frac{\partial \hat{y}_k(t:T_x)}{\partial T_2} & \frac{\partial \hat{y}_k(t:T_x)}{\partial T_1} \cdot \frac{\partial \hat{y}_k(t:T_x)}{\partial T_2} & \frac{\partial \hat{y}_k(t:T_x)}{\partial T_2} \cdot \frac{\partial \hat{y}_k(t:T_x)}{\partial T_2} \end{bmatrix} \quad \text{(Eq. 28)}$$

The solution to Equation 27 is:

$$\begin{bmatrix} \Delta T_X \\ \Delta T_1 \\ \Delta T_2 \end{bmatrix} = H^{-1} \cdot \begin{bmatrix} \sum_{k=1}^{M} \int_0^{t_R} (y_k(t) - \hat{y}_k(t:T_x)) \cdot \frac{\partial \hat{y}_k(t:T_x)}{\partial T_X} \cdot dt \\ \sum_{k=1}^{M} \int_0^{t_R} (y_k(t) - \hat{y}_k(t:T_x)) \cdot \frac{\partial \hat{y}_k(t:T_x)}{\partial T_1} \cdot dt \\ \sum_{k=1}^{M} \int_0^{t_R} (y_k(t) - \hat{y}_k(t:T_x)) \cdot \frac{\partial \hat{y}_k(t:T_x)}{\partial T_2} \cdot dt \end{bmatrix} \quad \text{(Eq. 29)}$$

$H^{-1}$ = inverse of the matrix $H$

Because of the form of the equation for the error squared, the H matrix is well behaved and invertible. Equation 29 produces a solution that is very close to the optimum, so that it is not necessary to iterate. All that remains to complete an implementation is to develop approximations for the three partial derivatives of each waveform estimate that appear in Equations 28 and 29. Keep in mind that the partial derivative itself is a waveform:

$$\frac{\partial \hat{y}_k(t:T_x)}{\partial T_X} \approx \frac{\hat{y}_k(t:(T_X(l+1) \ T_1(m) \ T_2(n))) - \hat{y}_k(t:T_x)}{T_X(l+1) - T_X(l)} \quad \text{(Eq. 30)}$$

$$\frac{\partial \hat{y}_k(t:T_x)}{\partial T_1} \approx \frac{\hat{y}_k(t:(T_X(l) \ T_1(m+1) \ T_2(n))) - \hat{y}_k(t:T_x)}{T_X(m+1) - T_1(m)}$$

$$\frac{\partial \hat{y}_k(t:T_x)}{\partial T_2} \approx \frac{\hat{y}_k(t:(T_X(l) \ T_1(m) \ T_2(n+1))) - \hat{y}_k(t:T_x)}{T_X(n+1) - T_2(n)}$$

The above solution to the self-adjusting problem is exemplary. Other similar variants would yield similarly satisfactory results. In any case the self-adjusting consists of the following steps;
1. Select a set of waveforms for which a reasonably accurate true CVT signal can be found.
2. Calculate the corrected CVT signal using the present set of filter parameters, T.
3. Calculate the error between the ideal and corrected waveforms
4. Iterate the process to minimize the error between the ideal and corrected waveforms.

A coarse search is often sufficient. A method described above allows speeding up the process once the coarse search is done. The self-adjusting process can be implemented in a number of ways. In particular, a provision can be made to automatically collect and include in the optimization each new case of system events suitable for usage in the self-adjustment procedure. Also, a provision can be made to stop adding new cases after certain confidence level is reached as to the value of the unknown CVT parameters.

Further, a provision can be made to actually use the filter for protection purposes only if the previous system events exhibited a very good match between the ideal and corrected values.

Yet further, values of best-fit CVT parameters can be monitored between various system events. Significant changes can be used to inhibit the corrector for security purposes, and/or to set art alarm signifying the problem including possible gradual failure of the CVT itself.

The above brief description sets forth rather broadly the more important features of the present invention in order that the detailed description thereof that follows may be better understood, and in order that the present contributions to the art may be better appreciated. There are, of course, additional features of the invention that will be described hereinafter and which will be for the subject matter of the claims appended hereto.

The capabilities of the present invention can be implemented in software, firmware, hardware or some combination thereof.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

As such, those skilled in the art will appreciate that the conception, upon which disclosure is based, may readily be utilized as a basis for designing other structures, methods, and systems for carrying out the several purposes of the present invention, ft is important, therefore, that the claims be regarded as including such equivalent constructions insofar as they do not depart from the spirit and scope of the present invention.

What is claimed:

1. A method of compensating a Capacitive Voltage Transformer (CVT) for transient errors, the method comprising:
    representing raw output voltage of a CVT by a series of digitally encoded samples;
    creating a digital filter, wherein a design for the digital filter is based upon an equivalent circuit diagram of the CVT;
    filtering the raw output voltage, wherein the raw output voltage is filtered using the digital filter;
    determining model parameters of the equivalent circuit diagram of the CVT, each model parameter being determined based on a relationship between at least two of a resistance, an inductance, and a capacitance of the equivalent circuit diagram of the CVT; and
    determining digital filter coefficients, the digital filter coefficients are determined in response to monitored system disturbances, each digital filter coefficient being determined based on a relationship between at least one of the model parameters and a fundamental frequency of the CVT.

2. The method of claim 1, wherein the model parameters of the equivalent circuit diagram of the CVT are determined based on monitored system events.

3. The method of claim 2, wherein the digital filter coefficients are self-adjusted by iterating:
selecting a set of waveforms; and
determining a corrected CVT signal using a present set of the digital filter coefficients; and
determining an error between the selected set of waveforms and corrected waveforms,
wherein the iterating is continued, until error is minimized, or is stopped and resumed based upon user programmable conditions or commands.

4. The method of claim 2, wherein at least one self-adjusted digital filter coefficient for the CVT is stored on a device implementing the method and is displayed to a device operator.

5. The method of claim 1, wherein at least three model parameters of the equivalent circuit diagram of the CVT represent the CVT in the equivalent circuit diagram of the CVT.

6. The method of claim 1, wherein the digital filter further comprises an added high-stop filter to suppress high frequency components in a corrected signal.

7. The method of claim 1, wherein the digital filter is tuned to at least one of the model parameters of the equivalent circuit diagram of the CVT.

8. The method of claim 1, wherein at least three digital filter coefficients for the CVT can be entered manually into a device implementing the method as a part of transferring set-points from a failed device to a replacement device or into a device implementing the method for a CVT of identical type identified by other devices implementing the method.

9. The method of claim 1, wherein departures from historical values in the determined model parameters of the equivalent diagram of the CVT are used to signal a possible gradual failure of the CVT.

10. The method of claim 1 wherein determining model parameters comprises:
determining a first model parameter, designated $T_1$, based on a relationship between capacitance at the CVT fundamental frequency, resistance at the fundamental frequency, and an equivalent burden resistance of the CVT;
determining a second model parameter, designated $T_2$, based on a relationship between the capacitance at a CVT fundamental frequency and resistance at the fundamental frequency; and
determining a third model parameter, designated $T_x$, based on a relationship between capacitance at CVT fundamental frequency, resistance at the fundamental frequency, the equivalent burden resistance of the CVT, and the inductance for the equivalent circuit diagram of the CVT.

11. The method of claim 1 wherein determining filter coefficients comprises:
determining a plurality of recursive coefficients $a_i$ based upon first respective relationships between a system nominal frequency, a cut-off frequency of a low-pass filter, and a number of samples in each cycle.

12. The method of claim 1 wherein determining filter coefficients comprises:
determining a plurality of non-recursive coefficients $b_i$ based upon second respective relationships between a system nominal frequency, a cut-off frequency of a low-pass filter, and a number of samples in each cycle.

13. An article of manufacture that includes a computer readable medium useable by a processor, the medium having stored thereon a sequence of instructions which, when executed by the processor, causes the processor to compensate a Capacitive Voltage Transformer (CVT) for transient errors, wherein the CVT transient error compensation is accomplished by:
representing raw output voltage of a CVT by a series of digitally encoded samples;
designing a digital filter, wherein a design for the digital filter is based upon an equivalent circuit diagram of the CVT;
filtering the raw output voltage, wherein the raw output voltage is filtered using the digital filter;
determining model parameters of the equivalent circuit diagram of the CVT, each model parameter being determined based on a relationship between at least two of a resistance, an inductance, and a capacitance of the equivalent circuit diagram of the CVT; and
determining digital filter coefficients, the digital filter coefficients are determined in response to monitored system disturbances, each digital filter coefficient being determined based on a relationship between at least one of the model parameters and a fundamental frequency of the CVT.

14. The article of manufacture of claim 13, wherein a self-adjusting process including the filtering the raw output voltage, the determining model parameters, and the determining filter coefficients is continued, or is stopped and resumed based upon user programmable conditions or commands.

15. The article of manufacture of claim 14, wherein at least one self-adjusted digital filter coefficient for the CVT is stored on a device implementing the article of manufacture and is displayed to a device operator.

16. The article of manufacture of claim 13, wherein at least three model parameters of the equivalent circuit diagram of the CVT represent the CVT in the equivalent circuit diagram of the CVT.

17. The article of manufacture of claim 13, wherein the digital filter further comprises an added high-stop filter to suppress the high frequency components in a corrected signal.

18. The article of manufacture of claim 13, wherein the digital filter is tuned to at least one parameter of the equivalent circuit diagram of the CVT.

19. The article of manufacture of claim 13, wherein the model parameters of the equivalent circuit diagram of the CVT are determined based on monitored system events.

20. The article of manufacture of claim 13, wherein at least three of the digital filter coefficients for the CVT can be entered manually into a device implementing the article of manufacture as a part of transferring set-points from a failed device to a replacement device or into a device implementing the method for a CVT of identical type identified by other devices implementing the method.

21. The article of manufacture of claim 13, wherein departures from historical values in the determined model parameters of the equivalent circuit diagram of the CVT are used to signal a possible gradual failure of the CVT.

22. A computer program product that includes a computer readable medium useable by a processor, the medium having stored thereon a sequence of instructions which, when executed by the processor, causes the processor to compensate a Capacitive Voltage Transformer (CVT) for transient errors, wherein the CVT transient error compensation is accomplished by:

representing raw output voltage of a CVT by a series of digitally encoded samples;

designing a digital filter, wherein a design for the digital filter is based upon an equivalent circuit diagram of the CVT;

filtering the raw output voltage, wherein the raw output voltage is filtered using the digital filter;

determining model parameters of the equivalent circuit diagram of the CVT, each model parameter being determined based on a relationship between at least two of a resistance, an inductance, and a capacitance of the equivalent circuit diagram of the CVT; and determining digital filter coefficients, the digital filter coefficients are determined in response to monitored system disturbances, each digital filter coefficient being determined based on a relationship between at least one of the model parameters and a fundamental frequency of the CVT.

* * * * *